United States Patent [19]
Hollis et al.

[11] Patent Number: 4,903,089
[45] Date of Patent: Feb. 20, 1990

[54] VERTICAL TRANSISTOR DEVICE FABRICATED WITH SEMICONDUCTOR REGROWTH

[75] Inventors: Mark A. Hollis, Concord; Carl O. Bozler, Sudbury; Kirby B. Nichols, Chelmsford; Normand J. Bergeron, Jr., New Bedford, all of Mass.

[73] Assignee: Massachusetts Institute of Technology, Cambridge, Mass.

[21] Appl. No.: 151,395

[22] Filed: Feb. 2, 1988

[51] Int. Cl.⁴ .............................................. H01L 29/80
[52] U.S. Cl. ...................................... 357/22; 357/15; 357/55; 437/29
[58] Field of Search ................ 357/22 E, 22 C, 22 D, 357/22 I, 55, 15

[56] References Cited

U.S. PATENT DOCUMENTS

| | | | |
|---|---|---|---|
| 4,378,629 | 4/1983 | Bozler et al. | 357/22 E |
| 4,530,149 | 7/1985 | Jastrzebski et al. | 357/23.9 |
| 4,586,240 | 5/1986 | Blackstone et al. | 148/DIG. 19 |
| 4,677,451 | 6/1987 | Parsons et al. | 357/22 E |
| 4,757,029 | 7/1988 | Koury, Jr. | 437/90 |

FOREIGN PATENT DOCUMENTS

WO 87/07432  12/1987  PCT Int'l Appl. ............... 357/22 E

OTHER PUBLICATIONS

Adachi et al., *IEEE Electron Device Letters*, EDL-6, No. 6, 264–266 (1985).
Clarke et al., *Proceedings IEEE/Cornell Conference on Advanced Concepts in High Speed Semiconductor Devices & Circuits*, 1987.
Frensley et al., *IEEE Trans. Electron Devices*, ED-32 (5), 952–956.
Mishra et al., *IEDM Tech. Dig.* 594–597 (1982).
Tang et al., *Proceedings IEEE/Cornell Conference on High-Speed Semiconductor Devices & Circuits* 250–259 (1983).

Primary Examiner—William D. Larkins
Attorney, Agent, or Firm—Hamilton, Brook, Smith & Reynolds

[57] ABSTRACT

A vertical transistor device is characterized by active regions vertically separated by a narrower control region. The control region is defined by conducting layer extensions which extend into a groove within which semiconductor material is regrown during device fabrication. The device is further characterized by regions of isolating material, located horizontally adjacent to the active regions, said isolating material serving to reduce parasitic capacitance and improve thermal distribution within the device, thereby improving frequency and power performance.

10 Claims, 6 Drawing Sheets

VERTICAL TRANSISTOR DEVICE FABRICATED WITH SEMICONDUCTOR REGROWTH

The Government has rights in this invention pursuant to Contract Number F19628-85-0002 awarded by the U.S. Department of the Air Force and the Defense Advanced Research Projects Agency.

BACKGROUND OF THE INVENTION

Vertical field effect transistors (VFETs) offer the advantages of greater density across a wafer than do lateral designs such as conventional field effect transistors. Many of the existing vertical transistor devices, particularly those required for power applications, suffer from problems such as large parasitic capacitance, crystal defects and electron traps at the control region, and a limited control region width resulting from depletion regions occurring at interfaces between dielectric and semiconducting materials.

Attempts have been made to produce VFET devices free of these problems. One such device is described by S. Adachi et al. in *IEEE Electron Device Letters, EDL*-6, No. 6, June 1985, pp. 264–266. In this device, a tungsten grating layer is sandwiched in $SiO_2$ and entirely embedded within the semiconductor material.

In *Proceedings: IEEE/Cornell Conference on High Speed Semiconductor Devices and Circuits,* 1987, Clarke et al. describe vertical semiconductor devices in which shadow evaporation is used to fabricate gates suspended over source regions. In *IEEE Transactions on Electron Devices, ED*-32, No. 5, May 1985, pp. 952–956, Frensley et al. describe a GaAs vertical MESFET in which gate layers are deposited at the bottom surface of grooves located between active semiconductor channels. Finally, in *Technical Digest of the International Electron Devices Meeting,* 1982, pp. 594–597, Mishra et al. describe a device similar to that of Frensley et al. wherein gate layers are deposited on groove surfaces between active semiconductor channels.

A class of devices related to VFETs, and having many problems in common with VFETs, is the class of permeable base transistors (PBTs). One such PBT is described in U.S. Pat. 4,378,629 of Bozler et al., the teachings of which are incorporated herein by reference. In that device, a metal base layer is sandwiched between single crystal emitter and collector regions. The base layer has openings therein which can be provided by forming the base as a grating. With sufficiently narrow openings in the grating, the metal/semiconductor Schottky barrier provides for barrier limited current flow.

A second PBT is described by Tang et al. in *Proceedings: IEEE/Cornell Conference on High Speed Semiconductor Devices and Circuits,* August 15–17, 1983, (IEEE Cat. No. 83CH1959-6), pp. 250–259. In this article, the authors describe a numerical simulation toward the design of a U-groove PBT in which semiconductor material above the grating material is replaced by a material having better dielectric characteristics in order to reduce gatesource capacitance.

Despite each of these attempts, parasitic capacitance and uncontrollable depletion regions remain as problems. A need still exists for a vertical transistor device having reduced parasitic capacitance, improved heat distribution characteristics, and a control region free of undesired depletion regions, crystal defects and electron traps.

SUMMARY OF THE INVENTION

Attempts using early designs of vertical field effect transistors (VFETs) to produce devices having satisfactory performance characteristics have proven less than satisfactory. This is partially a result of parasitic capacitance within the device which limits operating frequencies, as well as an inability to easily achieve structures having suitably small dimensions. Furthermore, surface-state-induced depletion regions from ungated sidewalls severely limited the minimum control region width, therefore preventing satisfactory operation in certain applications.

Results with the PBT are far more satisfactory; however, device performance is still adversely affected by parasitic capacitance. Furthermore, in the PBT, semiconductor regrowth interfaces tend to be located adjacent to the control region, thereby lowering performance due to crystal defects and electron traps in the region.

In accordance with the present invention, a vertical transistor device comprises one or more active cells each having first and second active semiconductor regions vertically separated by a semiconductor control region, said active cells being isolated horizontally by isolation regions located horizontally adjacent to each active region. (The terms "vertical" and "horizontal" as used herein are used only for reference relative to the semiconductor surface and do not limit the orientation of the device.) The isolation regions serve to reduce parasitic capacitance in the device and to provide vertical spacing between the control region and the interface between the active semiconductor material and the contact layer upon which it is deposited. Additionally, the isolation regions act, in some cases, to provide improved thermal distribution from the active cells thereby reducing the likelihood of thermal damage to the device. The control region has a width narrower than that of the first and second active regions resulting from a conducting gate layer adjacent to the control region and having extensions into the semiconductor material which comprises the device. The extensions define the control region and produce depletion regions which can be varied by applied voltage, thereby providing a means of controlling the device. By controlling the distance between the extensions, it is possible to accurately define the width of the control region for dimensions of 1 $\mu$ and below.

In a VFET of the type described herein, the conducting gate layer is a metal grating and the active first and second regions serve as source and drain. The device can be symmetrical, and, as such, the direction of current flow therethrough is not limited. Thus, either the first or second active region can serve as a source or drain, depending upon the particular application of the device. The control layer is ideally thick enough so that the depletion regions formed within it form current limiting channels which can serve to effectively pinch off current flow therethrough.

In a preferred method of fabricating the device described herein, a first isolating material of $SiO_2$ or $Si_3N_4$ is deposited upon a surface of epitaxial, n+doped, GaAs semiconductor. A conducting material such as tungsten (W) or doped poly-silicon is deposited upon a surface of the isolating material, and a second isolating layer is deposited upon the conducting layer, thereby providing a multilayered article having a conducting layer sandwiched between isolating layers, the three layers being deposited upon an epitaxial semiconductor surface of a contact layer. Using any of a variety of methods which can accurately remove material, at least one groove of material is then removed from the sandwich layers to expose the surface of the semiconductor crystal. The groove thus formed will serve as a semiconductor regrowth region. Additionally, the conducting material which is not removed remains as a grating to control device operation.

The isolating sidewalls of the groove are selectively etched back using a process which has a lesser effect on the material of the conducting layer than that of the isolation layers. This allows the conducting layer to extend into the groove, beyond the isolating material sidewalls. These extensions preferably extend beyond the isolating sidewalls to a distance on the order of the zero bias depletion width of the semiconductor. Such a configuration allows an operational mode in which the conducting layer is biased to draw the depletion region back to the conducting surface without being affected by the depletion regions resulting from the interface of isolation material and semiconductor material.

Once the conducting layer extensions are formed, semiconductor material, preferably of the type which comprises the epitaxial semiconductor material, is regrown within the groove. This regrown semiconductor material forms the first active region, the control region (adjacent the conducting layer extensions), and the second active region.

Metal contacts, including layers which are alloyed for ohmic contact are then deposited at appropriate locations on the device.

The grooves in which the semiconductor material will be regrown can be formed by a variety of techniques. In one such technique, a standard deep UV lithography is used to lay down a grating pattern having groove spacing of approximately 1-2 $\mu$. A metallic, etch-resistant material is then angle deposited on the surface, thereby providing narrow, etchable channels. The channels are then etched using a reactive ion etching process.

The conducting layer of the instant device preferably comprises tungsten. The metallic, etch-resistant material is preferably nickel. These materials are chosen because nickel is an excellent mask material since it can be removed with hydrochloric acid without harming tungsten conducting material or gallium arsenide semiconductor material. Tungsten is preferred because it can be etched using fluorine gas without harming nickel or gallium arsenide and allows for clean GaAs semiconductor regrowth over the extensions.

Finally, the device performance can be further enhanced by replacing the isolation material with materials having greater dielectric properties. In one embodiment, $SiO_2$ isolation layers are dissolved out of the device, and air acts as the isolating material. In a second embodiment, an etching process is used to remove the $SiO_2/W/SiO_2$ material layers located adjacent and between active cells. This embodiment allows for better performance because the cells can be spaced further apart, thereby providing lower thermal density without increasing parasitic capacitance between layered conducting material and the semiconductor substrate.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different Figures. The drawings are not necessarily to scale, emphasis instead being placed upon illustrating the principles of the invention.

DETAILED DESCRIPTION OF THE INVENTION

Figure 1:
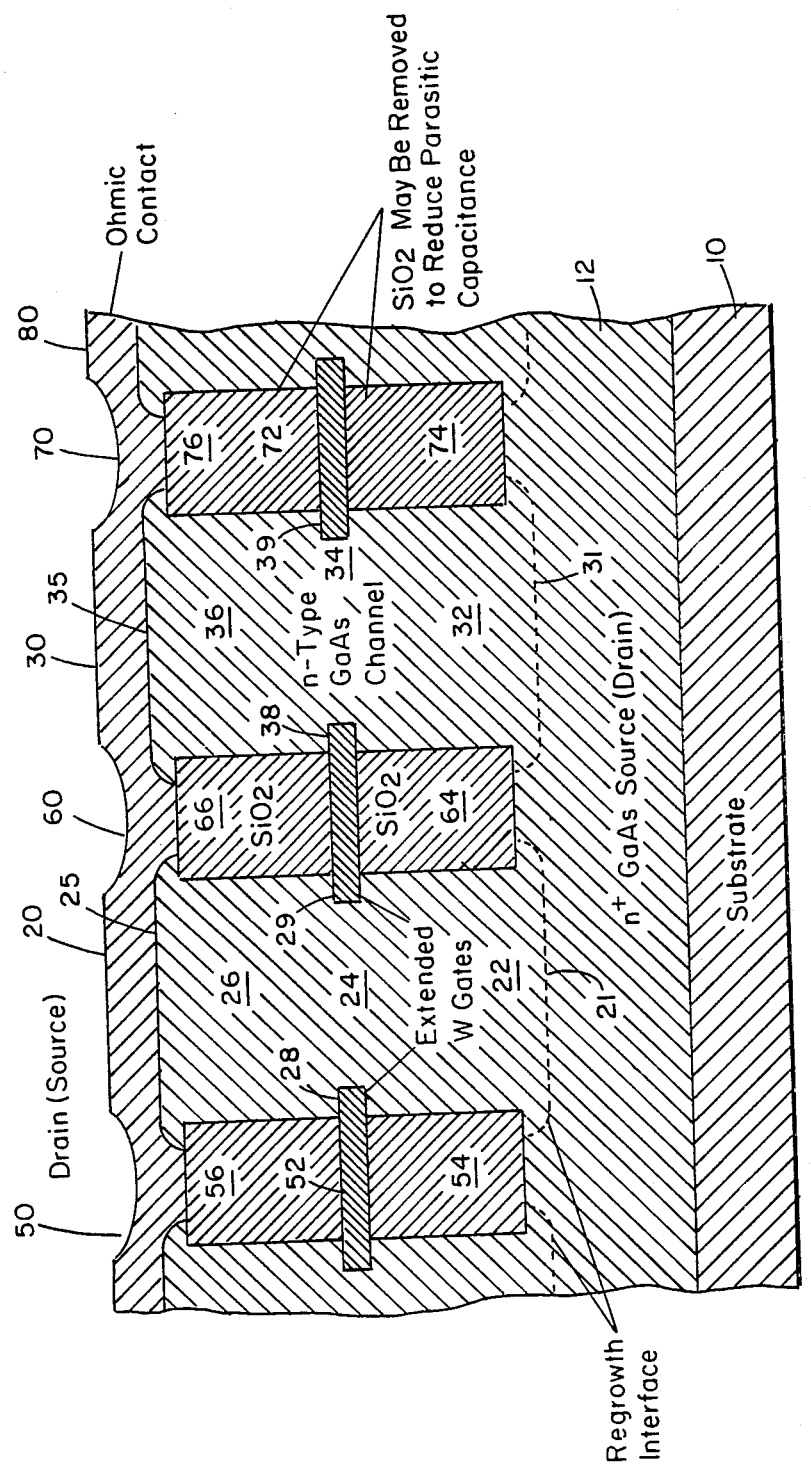
FIG. 1 is a cross-sectional view of a vertical field effect transistor (VFET) embodying the invention.

One embodiment of a vertical transistor device fabricated in accordance with the present invention is illustrated in FIG. 1. FIG. 1 is a schematic representation of a transistor device containing multiple active cells.

The device illustrated in FIG. 1 has a plurality of active cells, of which two full active cells 20 and 30 are shown. Multiple celled devices are illustrated herein for their ease in describingthe invention, however, transistor devices containing one active cell are intended to be described herein as well. A first substrate 10 comprising a substrate of doped or undoped material from group IV of the periodic table such as silicon or a compound of materials from groups III and V of the periodic table (III-V material), such as GaAs, serves as the support medium for the device. A doped epitaxial semiconductor layer 12 serving as a contact for a first active region 22, 32 is deposited upon the first substrate 10. The epitaxial layer 12 is preferably a doped III-V material. Layers 10 and 12 together provide a contact layer. In a variation on this embodiment, the contact layer comprises a single conducting layer of n+ or heavily doped material. In this embodiment, the epitaxial layer is not required, however, it may be present if desired. If the contact layer uses a semi-insulating substrate, however, the heavily-doped, epitaxial layer is needed.

Active cells 20 and 30 containing a first active region 22, 32 a control region 24, 34 and a second active region 26, 36 are grown upon epitaxial layer 12 at the regrowth interfaces 21 and 31. The active cells 20 and 30 are separated horizontally by isolation regions 50, 60 and 70. Each isolation region contains a lower isolation section 54, 64, 74 and an upper isolation section 56, 66, 76. The isolation sections must comprise some type of material having a low dielectric constant. Suitable materials include AlN, $Al_2O_3$, $Si_3N_4$, $SiO_2$ ($\epsilon = 3.9$), air ($\epsilon \sim 1.0$) and foamed polymeric materials, such as foamed polystyrene ($\epsilon \sim 1.1$). Additionally, diamond or beryllium oxide can be used due to their low dielectric constants and excellent thermal conductivity.

Within each isolation region 50, 60, 70 the upper and lower isolation sections are vertically separated by a conducting gate layer 52, 62, 72. In the preferred VFET, the gate layer thickness is greater than that used in PBT devices. The conducting gate layers 52, 62, 72 form a grating which has a common contact. The spaces of the grating serve to define the control regions 24, 34 of each cell 20, 30 in the device. The conducting layer preferably comprises tungsten (W). Each gate layer contains regions which extend into the semiconductor material comprising each active cell. For example, in cell 20, gate layers 52 and 62 have extensions 28 and 29 respectively. Likewise, in cell 30, gate layers 62 and 72 have extensions 38 and 39 respectively. Each cell is optionally capped 25, 35 by a heavily doped semiconducting material which serves to provide an enhanced contact surface for an ohmic contact layer 80.

In the preferred embodiment of the transistor device herein described, the extensions extend beyond the isolation materials to a distance on the order of the zero bias depletion width of the semiconductor. This configuration is necessitated by the effect of depletion regions formed by the contact of dissimilar materials, such as the isolating materials, with the semiconductor materials of the active regions. These depletion regions extend into the control region of the device, forming current-limiting channels capable of producing a current pinch off. As isolation materials in this device have been chosen as those which have very poor conductivity, they are extremely difficult to bias, thereby making control of the isolation/semiconductor interface depletion region extremely difficult to obtain. Instead, by providing extensions beyond the isolation regions with a material that is easily biased, it is possible to provide easily biased conducting layers extending through the depletion regions established by the isolation regions, thereby allowing a more effective control region.

The width of the control region is critical to the operation of each active cell, and therefore, the entire transistor device. If the width of the control region is substantially greater than twice the zero bias width of the interfacial depletion region, there is a conductive channel through the control region which includes a significant number of mobile charge carriers at zero gate voltage, thereby allowing significant current flow at low drain voltage levels. The device configured in this manner is termed a depletion mode FET. In such a device, negative gate voltages force the depletion regions toward the center of the control region producing a current limiting channel. At a sufficiently negative gate voltage, the channel will be pinched off and current flow through the control region will be effectively prevented. If the control region for a depletion mode FET is too wide, however, avalanche breakdown can occur in the control region before the current-limiting channel can form. Therefore, the control region width must be sufficiently small so that at the most negative desired operating gate voltage, all points within the control region are within the depletion region of the interface between the biased conducting material and the semiconducting control region, thereby effectively pinching off current flow through the control region.

A second device configuration, termed an enhancement mode FET, occurs when the control region width is approximately twice the zero bias depletion width. In this configuration, the unbiased gates form depletion regions that contact each other at the center of the control region. Thus, any positive biasing draws the depletion regions back toward the gates and produces the current-limiting channel.

The device can also be run in the PBT mode provided that the spacing between gates is less than twice the zero bias depletion width. In this configuration, the depletion regions overlap, effectively producing a barrier through the control region between the source and drain. If the barrier is not too thick, current can cross it, thereby resulting in the barrier limited current flow characteristic of permeable base transistors. If the gates are thicker, however, they can produce a barrier which is too thick for barrier limited current flow, this configuration being a characteristic of the FET modes.

If barrier limited current flow can occur, the device will operate in the PBT mode until a positive gate voltage large enough to separate the depletion regions and form a current limiting channel is applied. When this occurs, the operation of the device is essentially identical to that of the enhancement mode FET described previously.

It is important that substantially all openings in the conducting layer grating have nearly the same width. This requirement is because too close spacing of any two grating surfaces will restrict current flow through that control region relative to the other control regions in other active cells. Thus, any control region of the device which is narrower than the other control regions will contribute relatively little transconductance, but will still add to the parasitic capacitance of the device, thereby degrading the high frequency performance of the device.

The greatest contributor to parasitic capacitance in the device is the area of the conducting gate layer over or under an active portion of the device. The parasitic capacitance increases as both the conducting material area is increased and the spacing between the conducting layer and active area is decreased. Unfortunately, attempts to overcome parasitic capacitance by narrowing the width of the fingers of the conductive grating have led to failures because: (1) the closer spacing reduces the ability of the device to discharge excess heat, and (2) the narrow grating fingers have increased resistance. Thus, it is necessary to design the device to a configuration in which parasitic capacitance is minimized while heat transfer is maximized.

In the device depicted in FIG. 1, the isolation regions act to reduce parasitic capacitance and increase heat transfer. The lower isolation sections 54, 64 and 74 help reduce parasitic capacitance in the device in two ways. First they serve as a dielectric between the conducting layers 52, 62 and 72 and the semiconductor substrate. Second, they provide spacing between the conducting layers and the semiconductor substrate. Since capacitance is reduced by increasing the distance between charged surfaces, the relatively thick isolation regions of the device depicted in FIG. 1 further reduce parasitic capacitance in the device.

The thick isolation regions offer greater reductions in parasitic capacitance than are known in conventional PBTs, as well. This is because the isolation material between the conducting layer and the contact layer of the VFET has a much lower dielectric constant than the depleted semiconductor material of the PBT. Additionally, the thick isolation regions can serve as heat sinks, drawing excess heat from the active regions.

The device of FIG. 1 further benefits from the isolation regions because they serve to separate semiconductor regrowth interfaces 21, 31 from the control regions 24, 34 of the device. Each regrowth interface can have a high density of dislocations, crystal defects and electron traps, each of which serve to degrade semiconductor performance. Thus, it is desirable to locate these interfaces in a region separated from the control regions. The relatively thick lower isolation regions 54, 64 and 74 accomplish this by supporting the conducting layers (which define the control regions), at a distance from the interfaces at which the interfacial defects are negligible.

Heat removal from vertical semiconductor devices is a particular problem, especially in power transistor applications which require large current handling capabilities. U.S. Ser. No. 07/140,820 filed Jan. 5, 1988, of Bozler et al., the teachings of which are incorporated herein by reference, describes a vertical transistor device having excellent heat transfer properties which is especially useful for power applications. The methods of heat removal described therein can be incorporated into the instant device, thereby further improving its thermal characteristics.

Figure 2:
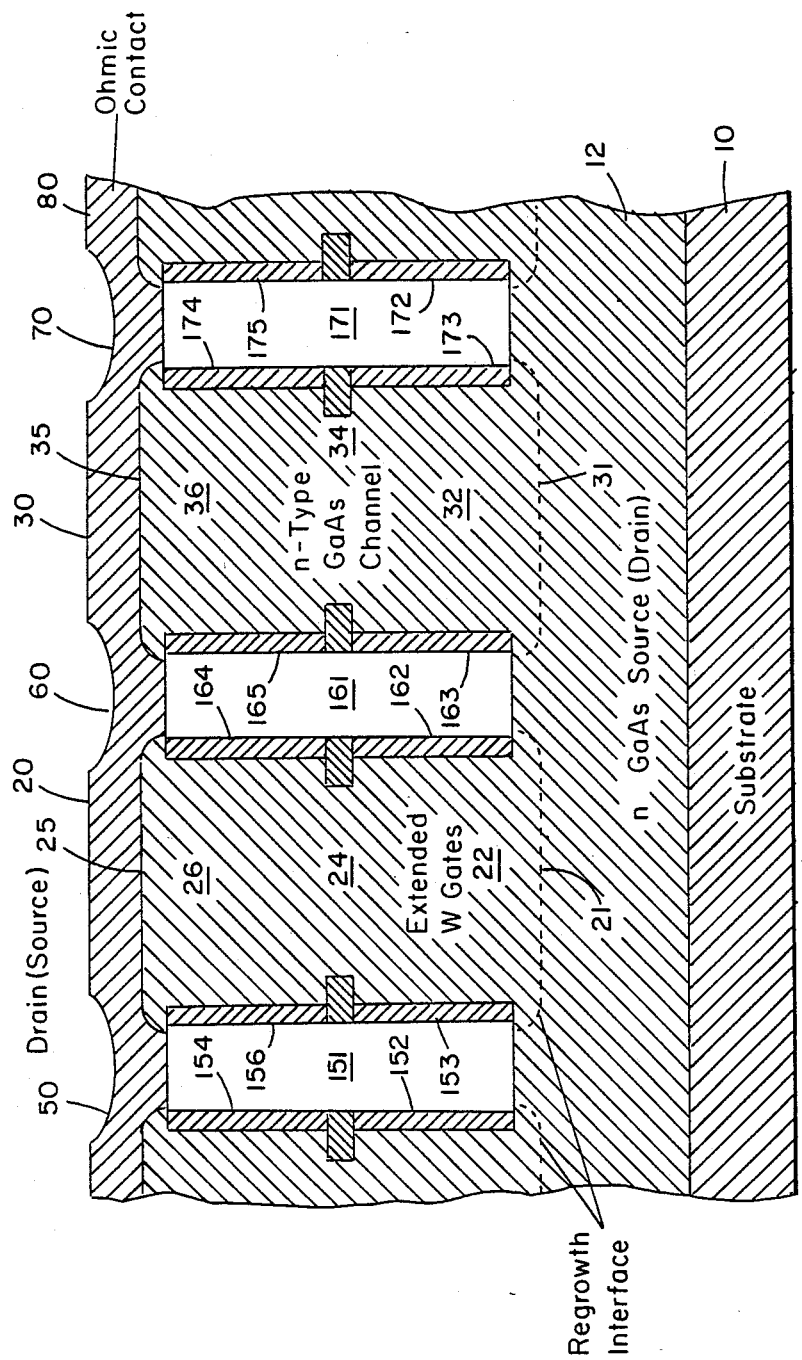
FIG. 2 is a cross-sectional view of another embodiment of a VFET embodying the invention.

Problems of parasitic capacitance and heat transfer are largely eliminated in the embodiment of the device represented schematically in FIG. 2. In FIG. 2, active cells 20 and 30 are essentially identical to those depicted in FIG. 1. The differences are found in isolation regions 151, 161 and 171. Rather than leaving the isolating/conducting/isolating structure intact, the embodiment shown in FIG. 2 is a vertical device in which the isolating/conducting/isolating layer structure has been removed, while leaving extensions 28, 29, 38 and 39 essentially intact within the active cells. It may be desirable to leave insulating sidewalls 152, 153, 154, 155, 162, 163, 164, 165, 172, 173, 174 and 175 intact to provide structural support; however, they can be removed if desired. This embodiment is advantageous in that it greatly reduces the area of conducting material over and under active semiconductor material, thereby reducing parasitic capacitance. Additionally, it allows greater spacing between the active cells without increasing parasitic capacitance. This greater spacing allows better heat distribution properties. Finally, the greater spacing allows the use of lithography techniques during fabrication which are far simpler and less expensive than those demanded for the high resolution patterns required by the device represented in FIG. 1.

A technique for fabricating the transistor devices thus far described will now be discussed with reference to FIGS. 3-9.

Figure 3:
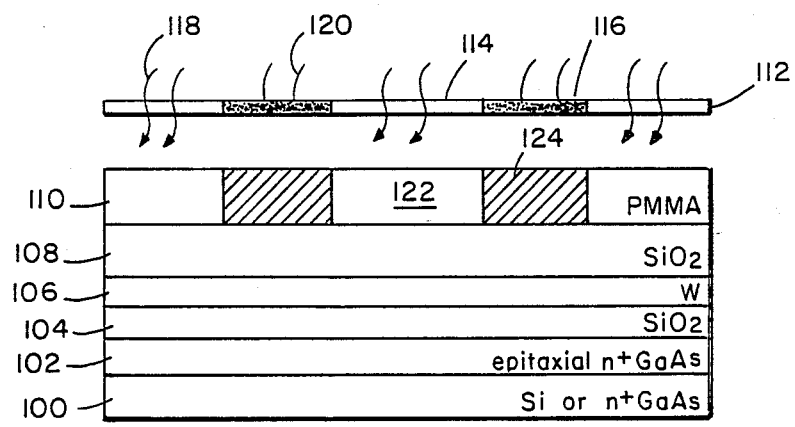
FIG. 3 is a cross-sectional view of a layered article of this invention undergoing deep UV lithography.

As illustrated in FIG. 3 one embodiment of the process involves forming a layered article in which an epitaxial layer 102 of a material such as n+GaAs is grown upon a substrate 100 of a group IV material such as silicon or a III-V material such as n+GaAs. A first isolation layer 104 is formed upon the epitaxial layer 102, and a conducting layer 106 is deposited upon the isolation layer 104. A second isolation layer 108 is grown upon the conducting layer 106 and the entire surface is coated with a photosensitive mask material 110. The isolating material is preferably $SiO_2$ or $Si_3N_4$, the conducting material is preferably W or doped polysilicon and the photosensitive material is preferably polymethylmethacrylate (PMMA). A precision photomask 112 having a grating pattern with a period of about 1 to 2 um is positioned over the layered article. The photomask has regions 114 which transmit collimated UV light 118 as well as regions 116 which do not transmit collimated UV light 120. Regions of layer 110 contacted by UV light 118 form etchable zones 122, while regions not so contacted 124 remain as unconverted resist material.

Figure 4:
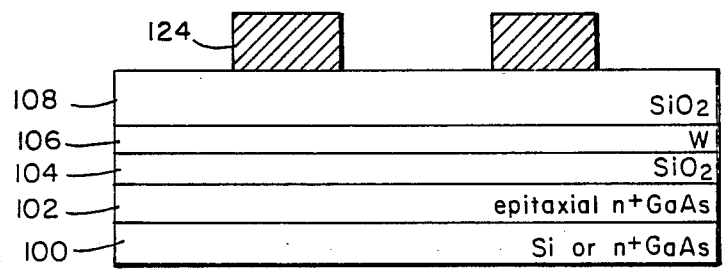
FIG. 4 is a cross-sectional view of the article of FIG. 3 following removal of a UV irradiated mask region, thereby providing a mask for angle evaporation.

FIG. 4 represents the same article after a developing step. The resulting layered article has a series of resist zones 124 remaining.

Figure 5:
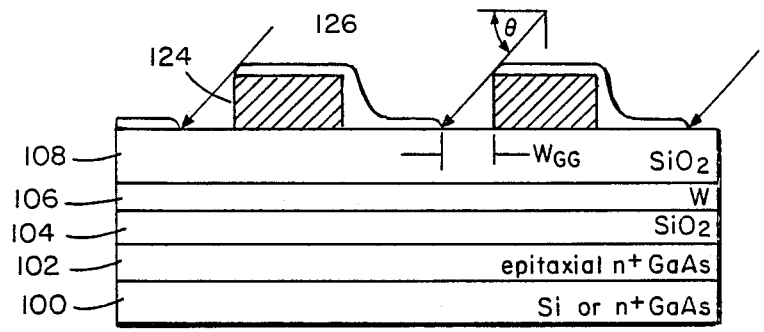
FIG. 5 is a cross-sectional view of the article of FIG. 4 undergoing an angle evaporation to provide a high resolution mask for reactive ion etching.

FIG. 5 represents the same article during a step to provide a narrower active cell via an angle evaporation of a metallic etch-resistant mask. In FIG. 5, an etch-resistant material 126, such as nickel is deposited on the surface of the layered article. The material 126 is deposited at an angle $\theta$ such that the resist zones 124 shadow the areas of the surface. The angle $\theta$ is chosen such that the shadow or gap width, $W_{GG}$, is equal to the desired active cell control region width. By varying angle $\theta$, it is possible to vary the ultimate control region size. Generally, the greater the value of $\theta$, the lower the value of $W_{GG}$.

Figure 6:
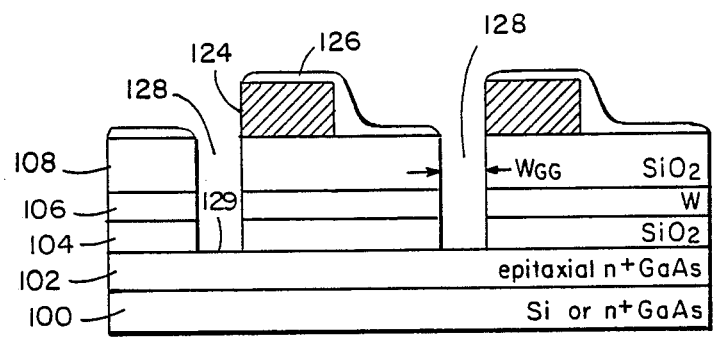
FIG. 6 is a cross-sectional view of the article of FIG. 5 following a reactive ion etching step.

FIG. 6 represents the article following a reactive ion etching step using a material such as $CF_4$ plasma as the etchant. In FIG. 6, grooves 128 having a width of $W_{GG}$ have been cut into the layered article. The reactive ion etch is allowed to proceed until the etch has removed substantially all isolation and conducting material in the groove, thereby exposing the epitaxial surface 129. By forming a series of parallel grooves through the upper layers of the device, the reactive ion etching step has served to produce a comb-like grating morphology in the conducting layer 106. The fingers of the conducting grating will serve as the gates of the transistor device functioning to control the Schottky barrier depletion region as the bias on the fingers is varied.

Figure 7:
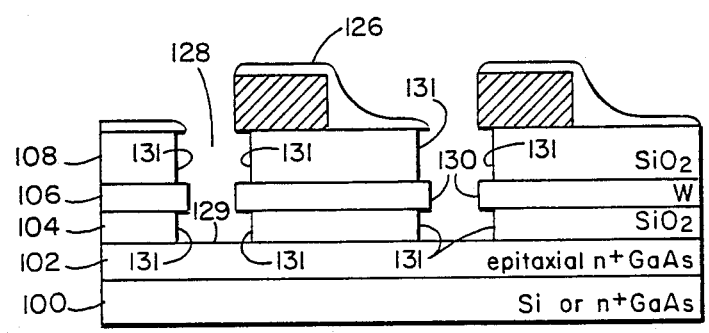
FIG. 7 is a cross-sectional view of the article of FIG. 6 following an etch-back of the isolation material sidewalls.

FIG. 7 represents the structure resulting from a selective etch step which is used to etch back the walls 131 of the isolation material layers 104 and 108. In the selective etch, a $CF_4$ plasma or dilute HF acid solution is provided which etches isolation layers 104 and 108 at a faster rate than it etches the conducting layer 106. This results in conducting layer extensions 130 which extend beyond the isolating material sidewalls 131 into the space of groove 128. As explained previously the extensions 130 preferably extend beyond the isolation material sidewalls 131 to a distance on the order of the zero bias depletion width of the semiconductor.

Figure 8:
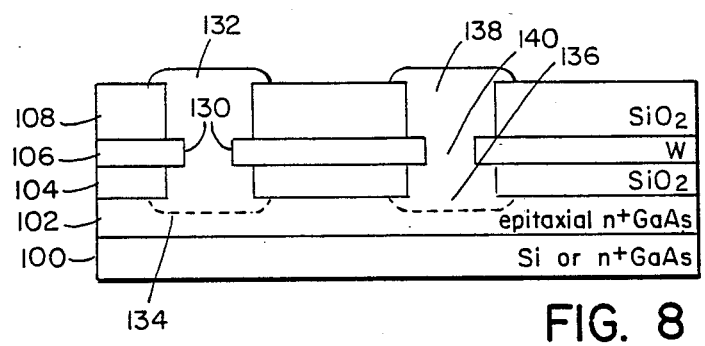
FIG. 8 is a cross-sectional view of the article of FIG. 7 following a semiconductor regrowth within the etched grooves.

FIG. 8 is a schematic representation of the device following semiconductor regrowth. In FIG. 8, the resist zones and metallic etch-resistant material have been removed before the regrowth step in order to prevent contamination. Additionally, the exposed surfaces of the epitaxial layer 102 have been cleaned by a light etching. Immediately after the cleaning of the epitaxial surface, semiconductor material 132 which is similar to or the same as that of the epitaxial layer 102 is grown within the channels. Often the regrowth material differs only in that it is not as heavily doped as the epitaxial layer. The regrowth of semiconductor material can be achieved using a process such as vapor phase epitaxy (VPE) or molecular beam epitaxy (MBE), however, organometallic chemical vapor deposition (OMCVD) is preferred. The regrowth begins at the regrowth interface 134 which was the cleaned surface of the epitaxial layer 102. The regrown semiconductor material 132 is allowed to grow to a height at least above that of the upper surface of the gate layer extensions 130. This provides a first active region 136 and a second active region 138 separated vertically by a control region 140. These respectively correspond to the first active regions 22 and 32, the second active regions 26 and 36, and the control regions 24 and 34 of the device depicted in FIGS. 1 and 2. By regrowing the semiconductor material 132 and forming a control region 140 at a point above the regrowth interface 134 rather than at the interface 134 itself, the control region is not subject to the same degree of crystal defects, electron traps and other discontinuities as is found at the interface. This effect was described in greater detail in the discussion of FIG. 1.

At this point, ohmic contacts can be applied to contact the active regions and gate of the device, thereby providing a fully fabricated vertical transistor device. Depending on the direction of current flow through the active regions 136 and 138, either can serve as a source or drain region.

If, for example, SiO$_2$ has been used as the material of the isolation layers, it may be desirable to provide further processing steps, such as contacting the article with an HF acid solution, in order to remove it. The dielectric constant, $\epsilon$, of SiO$_2$ is approximately 3.9. If the SiO$_2$ is replaced with air ($\epsilon \sim 1.0$) or a foamed polymeric material such as foamed polystyrene ($\epsilon \sim 1.1$), an almost four-fold difference in the dielectric properties of the isolation zones is achieved. This serves to greatly decrease the parasitic capacitance in the device and allows device performance at higher frequencies than previously obtained.

Figure 9:
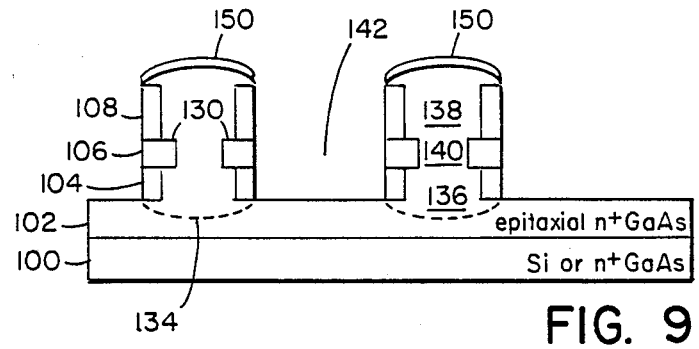
FIG. 9 is a cross-sectional view of one embodiment of the invention in which the article of FIG. 8 has undergone a second etch to remove material between active cells of the device.

Another embodiment of the fabrication process containing an additional processing step is presented in FIG. 9. In FIG. 9, a metallic, etch-resistant material 150, such as nickel is deposited upon the surfaces of the semiconductor material residing within the grooves. A second reactive ion etching is performed, this time serving to etch the isolation regions, to thereby provide an isolation groove 142. This second reactive ion etching has no effect on semiconductor regions 136, 138 and 140, nor on the gate layer extensions 130. The etching does, however, remove isolation layers 104 and 108, as well as conducting layer 106 from the isolation regions between the active cells. The second etching should preferably remove isolation material to a point at least below the conducting layer. This isolation region removal is advantageous for many reasons. For example, since the isolation region no longer contains an area of conducting material extending over the epitaxial layer, the major source of parasitic capacitance in the device has been reduced. Because the existence of conducting material within the isolation layer is no longer a source of parasitic capacitance, it is possible to provide greater spacing between active cells without decreasing the performance of the device. The greater spacing allows improved thermal characteristics in the device, thereby reducing the likelihood of catastrophic overheating, and allows patterning of the layered article using a simpler lithography process as well.

Once material has been removed from the isolation region to form the isolation groove, a variety of options for completing the device are available. One option is to leave the isolation grooves open. In this method, the metallic, etch-resistant material is optionally removed from the top surface of semiconductor in the active cell, and ohmic contacts are angle evaporated thereon. In another embodiment of the invention, the entire surface of the device can be filled with a polymeric material, at least to the level of filling the isolation groove regions. The material can then be planarized to reveal the upper surface of the active cells. The metallic, etch-resistant material is then optionally removed. An ohmic contact can then be evaporated over the entire surface of the device, thereby providing an upper contact between each active cell. Finally, f desired the polymeric material can be dissolved, thereby leaving air-filled isolation regions between the active cells.

The present invention is not intended to be limited to the specific lithography process described for the production of the active cell grooves. For example, electron beam, ion beam, or X-ray lithography systems can be used to produce the narrow channels within which the active cells will be located. While any of these methods would replace the angle deposition step of FIG. 4, they are not currently preferable to the embodiment described.

The deep UV lithography system, as used in FIGS. 3–5, currently is much less expensive than any of the electron beam, ion beam, or X-ray lithography systems currently available. Additionally, the deep UV exposure is much faster and can be used to expose an area much larger than possible with any of the other techniques. Finally, the UV lithography allows the use of rugged, currently-available photomasks. In contrast, ion beam and X-ray lithography require sophisticated membrane masks.

Figure 10:
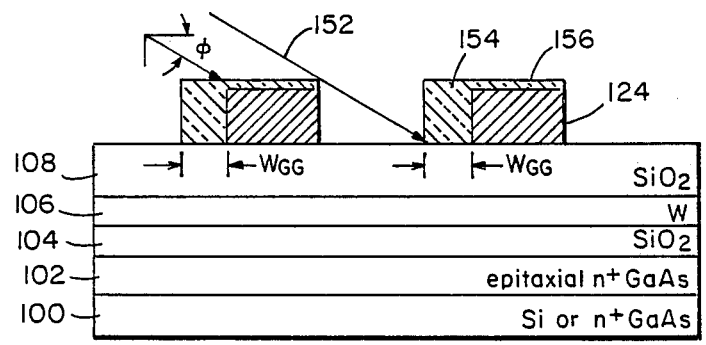
FIG. 10 is a cross-sectional view of another embodiment for forming grooves within the layered article wherein the article of FIG. 3 is subjected to an angle evaporation leaving material of varying depths upon the surface of the layered article.
Figure 11:
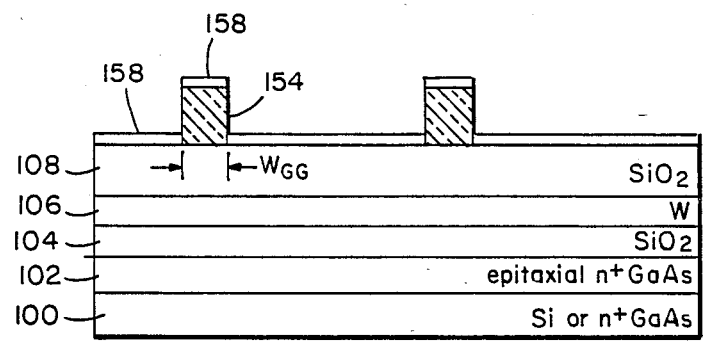
FIG. 11 is a cross-sectional view of the article of FIG. 10 in which the evaporated material has been lightly etched, thereby exposing the UV photomask, followed by UV photomask removal and conventional metallic mask deposition.
Figure 12:
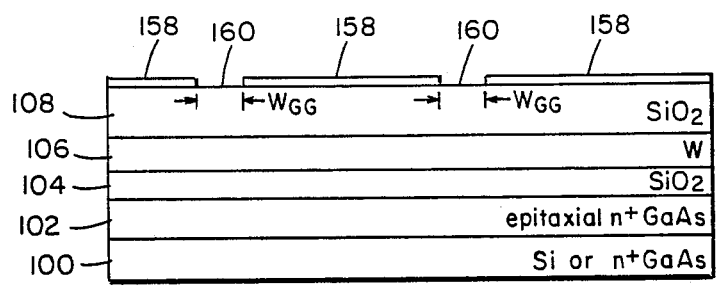
FIG. 12 is a cross-sectional view of the article of FIG. 11 in which material from the angle evaporation has been removed, thereby providing a metallic mask for high resolution, reactive ion etching.

A second lithography method which allows the formation of high resolution grooves in the layered article after a deep UV lithography step is illustrated in FIGS. 10–12.

In FIG. 10, the article of FIG. 4 is subjected to an angle evaporation to deposit thick material layers 154 upon the surface of isolation layer 108 and thin material layers 156 upon resist zone 124. The material undergoing the angle evaporation 152 is any material which can be evaporated and which is not soluble in the solutions used to remove resist zones 124. The angle $\phi$ of the evaporation is chosen such that the width $W_{GG}$ of the thick material layer 154 is approximately equal to the desired width of the control region of the active cell.

In FIG. 11, a light etch has been used to remove the thin layers of material and this step has been followed by removal of resist regions. Finally a metallic, etch-resistant material 158, such as nickel, has been deposited upon the top surface of isolation layer 108 and the thick material layer 154.

FIG. 12 depicts the layered article fully prepared for a reactive ion etching to produce active cell grooves. In FIG. 12, the thick material layer has been removed along with any metallic, etch-resistant material contained thereon. The resulting surface contains a metallic, etch-resistant layer 158 within which are gaps 160 exposing the surface of the upper isolation layer 108. The gaps 160 are of a width, $W_{GG}$, which approximates the desired width of the control region of the active cell. At this point, process steps such as those presented in FIGS. 6–8 or 6–9 may be carried out.

While the invention has been particularly shown and described with reference to the preferred embodiments thereof, it will be understood by those skilled in the art that various changes in form and details may be made therein without departing from the spirit and scope of the invention as defined by the appended claims. For example, while the invention has been illustrated with n-type doping, the device is capable of operating with opposite type doping, such as p-type doping.

We claim:

1. A vertical transistor device comprising one or more active cells which comprise:
   a. first and second semiconductor regions vertically displaced in semiconductor material and separated by a control region;
   b. isolation regions adjacent to the sides of the first and second semiconductor regions, the isolation regions being formed of a material which is different from the semiconductor material and which has a lower dielectric constant; and
   c. a conducting layer extending from at least one isolation region, thereby defining the control region, said control region being narrower than at least one of either the first or second semiconductor regions wherein the conducting layer extends beyond the isolation region material to a distance on the order of the zero bias depletion width of the semiconductor due to the isolation region material to semiconductor interface.

2. A vertical transistor device as in claim 1 wherein the conducting layer vertically separates the isolation layers adjacent the first and second semiconductor regions.

3. A vertical transistor device as in claim 1 wherein the conducting layer comprises a grating.

4. A Vertical transistor device as in claim 3 wherein the grating forms depletion regions which form current-limiting channels.

5. A vertical transistor device as in claim 3 which comprises a vertical field effect transistor.

6. A vertical transistor device as in claim 3 wherein the space between teeth of the grating defines the control region.

7. A vertical transistor device as in claim 6 wherein the width of the control region is less than the width of the first and second semiconductor regions.

8. A vertical transistor device as in claim 3 wherein the conducting layer is selected from the group consisting of tungsten and doped poly-silicon.

9. A vertical transistor device as in claim 3 wherein the isolation layers contain material selected from the group consisting of diamond, beryllium oxide, aluminum oxide, aluminum nitride, silicon dioxide, silicon nitride, air, and foamed polymeric materials.

10. A vertical transistor device as in claim 3 wherein the semiconductor material is gallium arsenide.

* * * * *